United States Patent

Swensen et al.

[11] Patent Number: 6,015,152
[45] Date of Patent: Jan. 18, 2000

[54] SEAL RETAINER HAVING AN INDICATOR

[75] Inventors: Jeffrey E. Swensen; Terence J. Nolan, both of Eldersburg; J. Loyd Spence, Elkridge; Edward P. Rhyne, Columbia, all of Md.

[73] Assignee: EG&G Pressure Science, Inc., Beltsville, Md.

[21] Appl. No.: 08/998,595

[22] Filed: Dec. 29, 1997

Related U.S. Application Data

[63] Continuation-in-part of application No. 08/778,633, Jan. 3, 1997, Pat. No. 5,713,582.

[51] Int. Cl.⁷ .................................................. F16J 15/00
[52] U.S. Cl. ........................... 277/321; 277/630; 285/379
[58] Field of Search ..................... 277/317, 321, 277/608, 609, 616, 630, 647, 600, 639; 285/93.3, 379, 382; 411/999; 403/27

[56] References Cited

U.S. PATENT DOCUMENTS

| | | | |
|---|---|---|---|
| 936,554 | 10/1909 | Mueller | 277/321 |
| 2,339,478 | 1/1944 | Hoheisel | 277/610 |
| 2,795,444 | 6/1957 | Nenzell | 411/542 |
| 3,499,655 | 3/1970 | Czernik et al. | 277/600 |
| 3,578,346 | 5/1971 | Jelinek | 277/611 |
| 3,857,572 | 12/1974 | Taylor et al. | 277/609 |
| 3,871,668 | 3/1975 | Coker et al. | 277/643 |
| 3,945,737 | 3/1976 | Herbenar | 403/27 |
| 4,088,347 | 5/1978 | Bruggemann et al. | 285/93 X |
| 4,114,906 | 9/1978 | Jelinek | 277/596 |
| 4,348,032 | 9/1982 | Hanson et al. | 277/594 |
| 4,648,607 | 3/1987 | Yamada et al. | 277/598 |
| 4,813,691 | 3/1989 | Schoenborn | 277/598 |
| 5,011,162 | 4/1991 | Jelinek | 277/644 |
| 5,145,190 | 9/1992 | Boardman | 277/596 |
| 5,364,109 | 11/1994 | Sihon | 277/592 |
| 5,375,851 | 12/1994 | Mockenhaupt | 277/598 |
| 5,518,257 | 5/1996 | Breaker | 277/612 |
| 5,529,313 | 6/1996 | Malks | 277/598 |
| 5,544,902 | 8/1996 | Belter | 277/609 X |
| 5,558,344 | 9/1996 | Kestly et al. | 277/608 |
| 5,564,714 | 10/1996 | Katsuno et al. | 277/630 |
| 5,580,065 | 12/1996 | Ueta | 277/591 |
| 5,730,448 | 3/1998 | Swensen et al. | 277/630 |
| 5,735,532 | 4/1998 | Nolan et al. | 277/630 |

FOREIGN PATENT DOCUMENTS

| | | | |
|---|---|---|---|
| 6-94133 | 4/1994 | Japan | 277/630 |
| 6-94136 | 4/1994 | Japan | 277/630 |

OTHER PUBLICATIONS

Pressure Science Incorporated Catalog—"Taylor's Resilient Metallic Seals"—1981—pp. 2, 6 and 23.

*Primary Examiner*—Lynne H. Browne
*Assistant Examiner*—Greg Binda

[57] ABSTRACT

A sealing assembly is disclosed for creating a seal between first and second mating members or components. The sealing assembly basically includes a seal retainer with one or more annular seals coupled thereto. The seal retainer including a substantially flat body portion lying in a plane and with at least one resilient retaining element integrally formed with said body portion as a one-piece, unitary member for engaging the seal(s) to retain the seal(s) thereto. The seal retainer has an indicator formed on its body portion to indicate if the seal retainer has been used. In the preferred embodiment the indicator is a raised protrusion which normally extends outwardly from the plane of body portion of the seal retainer. Once the seal retainer is used, the raised protrusion of the indicator is deformed inwardly into the plane of the body portion of the seal retainer.

24 Claims, 6 Drawing Sheets

SEAL RETAINER HAVING AN INDICATOR

CROSS REFERENCE TO RELATED APPLICATION

This application is a continuation-in-part of U.S. patent application Ser. No. 08/778,633, filed Jan. 3, 1997, now U.S. Pat. No. 5,713,582.

FIELD OF THE INVENTION

The present invention generally relates to a seal retainer which holds one or more seals. More specifically, the present invention relates to a thin seal retainer with integrally formed retaining members for retaining and locating one or more seals between a pair of members or components with orifice(s), port(s) or counterbore(s) to be sealed.

BACKGROUND OF THE INVENTION

Seals of various types and shapes have been employed to prevent fluid from escaping from a joint along a fluid flow path or in a fluid receptacle. Joints in the flow path or in a container are of course formed whenever two or more members or components are brought together to form a continuous conduit or a fluid receptacle. One common type of seal is a ring seal which is employed between members or components along the flow path, thus preventing fluid from escaping between the two members. These two members or components often have grooves or counterbores formed therein to receive the ring seal and to form a seal gland.

These ring seals are resilient due to their material and their geometric shape so that the ring seal fills the gap between the adjacent members or components defining the flow path. The desired result is that the ring seal will firmly abut both members or components at all points along the seal so that the gap is completely blocked by the ring seal.

These ring seals can be installed in a variety of ways between the pair of members. The most common method is to merely place the ring seal in the groove or counterbore which forms the seal gland. However, in this method, the seal often moves or shifts during assembly of the two parts. Moreover, it is often difficult in certain applications to assemble the two parts together without the seal falling out of position. This causes the seal to be contaminated or damaged during installation.

It is also known that it is possible to use retainer plates for holding a seal in place to assist in the assembly. One example of a retainer plate is disclosed in U.S. Pat. No. 3,857,572 to Taylor et al. As seen in FIGS. 3 and 4 of the Taylor et al. patent, the ring seals are retained in openings of the retainer plate by a split wire ring which fits in a groove of the retainer plate and engages the outer surface of the ring seal. Also, the retainer plate of the Taylor et al. patent has holes for receiving bolts to secure the retainer plate to the members or components being coupled together.

While the retainer plate of the Taylor et al. patent is useful in certain applications, it may require special tooling to be used in certain circumstances. In particular, the retainer plate of the Taylor et al. patent is designed to be used with a pair of members or components which do not include a counterbore or groove for receiving the ring seal. Rather, the retainer plate of the Taylor et al. patent must have a thickness which permits the proper amount of inward deflection of the ring seal to insure proper sealing. Moreover, the retainer plate of the Taylor et al. patent is a multi-part retainer plate which can be more costly to manufacture.

Retainer plates are also known which, to retain the ring seals in place, utilize a friction type fit. For example, a retainer plate could be provided with a circular opening and the ring seal could be made slightly elliptical such that the ring seal is elastically deformed during insertion of the seal into the circular opening. One drawback of this type of retainer plate and seal assembly is that the ring seal typically must have a large diameter such that the elliptical shape can be easily deformed for insertion into the round opening of the retainer plate. Another drawback of this type of retainer plate and seal assembly is that it requires deformation of the seal which can result in the seal being contaminated or damaged during installation. Moreover, this type of retainer plate typically requires a substantially rigid plate with a substantial thickness such that the seal cannot be used with mating members or components having counterbores.

In view of the above, it is apparent to those skilled in the art that there exists a need in the art for a seal retainer which can be used with a pair of mating members or components with at least one of the members or components having a counterbore for receiving the ring seal. Moreover, there exists a need for an inexpensive seal retainer which can be relatively easily manufactured and installed. Moreover, there further exists a need for a seal retainer which permits seals to be installed between a pair of mating members or components without contact by hands or tools which could contaminate or damage the seal or seals. This invention addresses these needs in the art, as well as other needs which will become apparent to those skilled in the art once given this disclosure.

SUMMARY OF THE INVENTION

One object of the present invention is to provide a seal retainer which can be utilized with one or more highly reliable metallic seals to locate and retain the seal or seals with respect to orifice(s), port(s), or counterbore(s) to be sealed.

Another object of the present invention is to provide a seal retainer which can be used with one or more seals to retain the seal retainer to one of the mating members or components prior to coupling of the mating members or components together to prevent loss of the seal or seals in difficult assembly orientations.

Another object of the present invention is to provide a seal retainer which provides the installer with control of the seal or seals in inverted or vertical assembly situations.

Still another object of the present invention is to provide a seal retainer whereby the seal or seals can be installed without contact by hands or tools between the pair of mating members or components to avoid contamination or damage to the seal or seals.

Yet another object of the present invention is to provide a seal retainer that is relatively inexpensive to manufacture.

The foregoing objects are basically attained by providing a seal retainer for coupling at least one seal thereto, comprising a substantially flat, flexible body portion lying in a plane and with at least one seal receiving aperture; an indicator integrally formed with the body portion as a one-piece, unitary member, the indicator being a deformable member which extends outwardly from the plane of the body portion; and at least one resilient retaining element integrally formed with the body portion as a one-piece, unitary member, the at least one retaining element extending inwardly from the body portion into the at least one seal receiving aperture to a free end.

The foregoing objects can also be attained by providing a sealing assembly for creating a seal between first and second members, comprising at least one annular seal with first and second longitudinally facing sealing surfaces and an outwardly facing cavity located between the first and second longitudinally facing sealing surfaces; and a seal retainer coupled to the at least one seal, the seal retainer including a substantially flat body portion lying in a plane and with at least one resilient retaining element integrally formed with the body portion as a one-piece, unitary member for engaging the cavity of the at least one seal to retain the at least one seal thereto the seal retainer further including an indicator integrally formed with the body portion as a one-piece, unitary member, the indicator being a deformable member which extends outwardly from the plane of the body portion.

Other objects, advantages and salient features of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
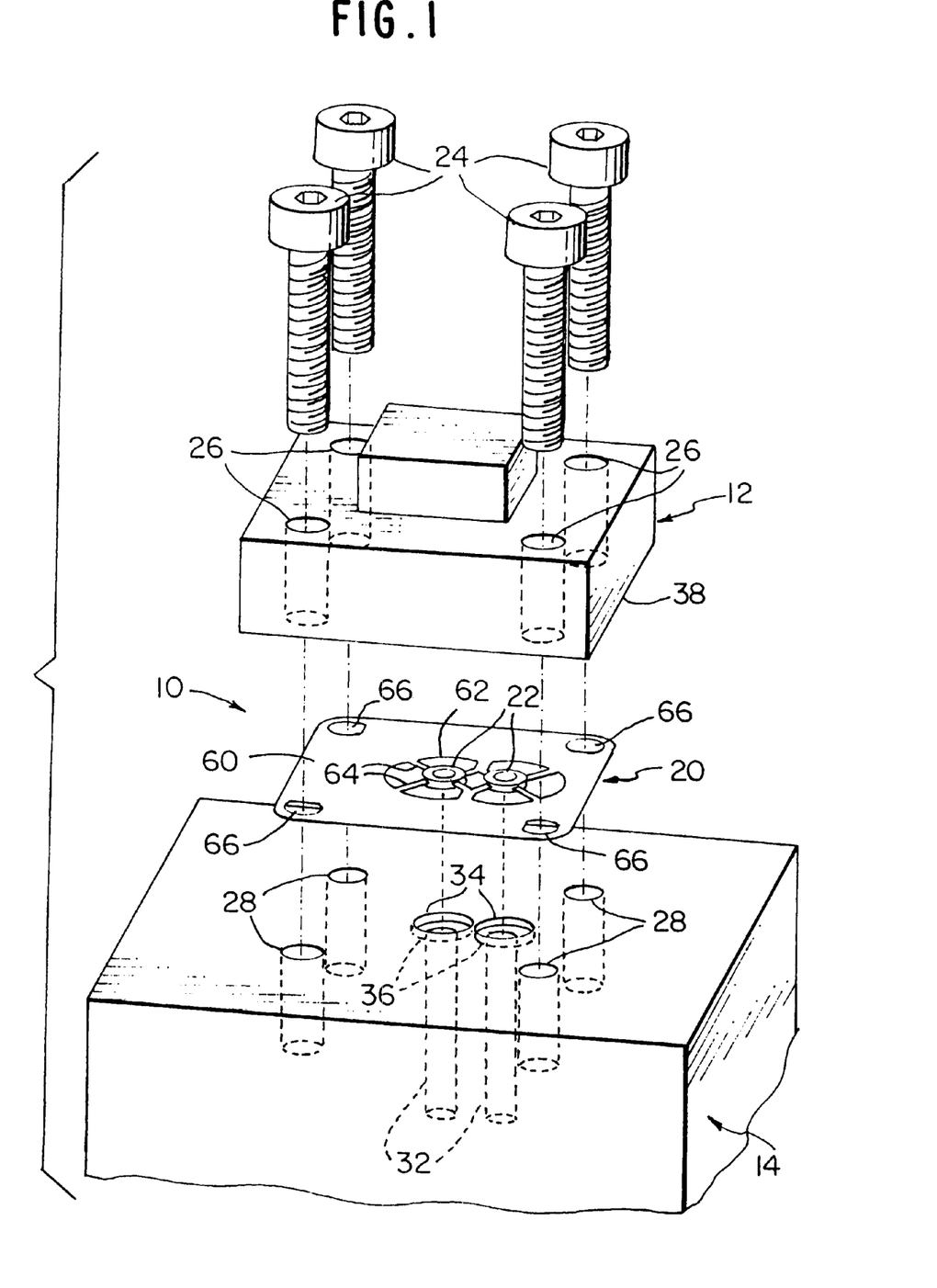
FIG. 1 is a partial exploded perspective view of a sealing assembly with a pair of C-shaped ring seals coupled to a seal retainer in accordance with a first embodiment of the present invention, and which is to be compressed between a pair of mating members or components to create a seal therebetween.
Figure 2:
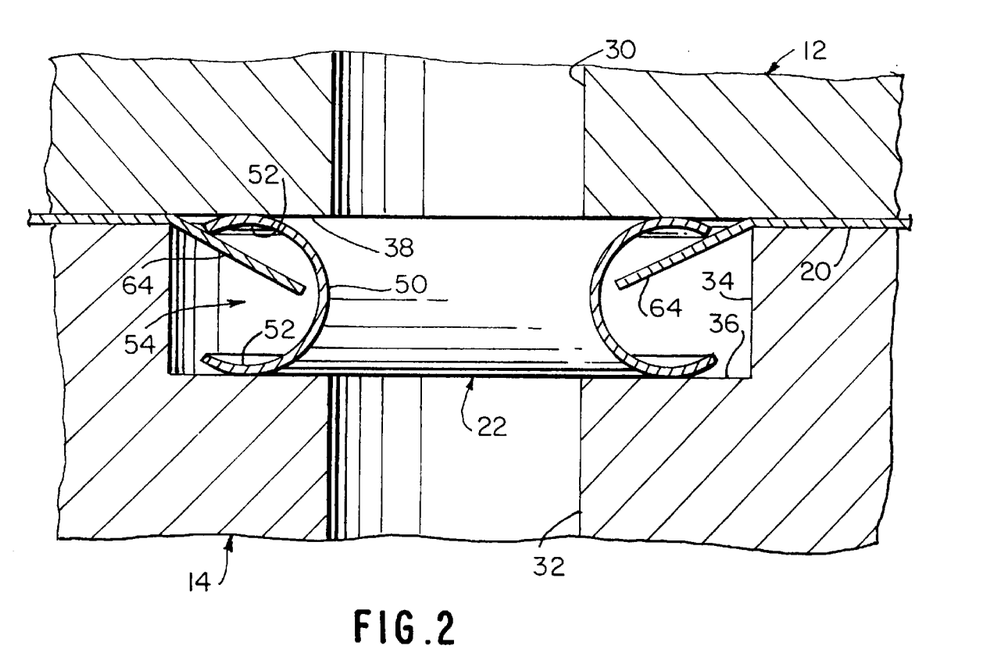
FIG. 2 is a partial, enlarged cross sectional view of a sealing assembly illustrated in FIG. 1 after being coupled to a pair of mating members or components in accordance with the first embodiment of the present invention.

Referring initially to FIGS. 1 and 2, a sealing assembly 10 in accordance with a first embodiment of the present invention is illustrated prior to being coupled between a pair of mating members or components 12 and 14. Sealing assembly 10 basically includes a seal retainer 20 and a pair of seals 22 coupled to seal retainer 20.

Sealing assembly 10 will only be described and illustrated with a diagrammatic illustration of mating members or components 12 and 14, since it will be readily apparent to those skilled in the art from this disclosure that the precise construction of the seal retainer 20, the number and locations of seals 22 will depend upon the particular application, as well as the particular structure of components 12 and 14.

Sealing assembly 10 is especially useful in the semiconductor process equipment and vacuum equipment industries or any other industries where high reliability and extremely tight sealing is required. In particular, sealing assembly 10 is preferably designed to provide a highly reliable seal. For example, sealing assembly 10 is preferably designed to pass a leakage test on the order of magnitude of $10^{-9}$ cc/sec helium.

In the example illustrated in FIGS. 1 and 2, component 12 is releasably coupled to component 14 via four bolts or fasteners 24 in a conventional manner. Of course, more or less bolts can be utilized depending upon the application. Component 12 can be, for example, a valve or regulator, while component 14 can be, for example, a manifold or base member. More specifically, component 12 has four bores 26 for slideably receiving fasteners 24 therethrough, while component 14 has four threaded bores 28 for threadedly receiving fasteners 24 therein, such that component 12 is releasably coupled to component 14 via fasteners 24.

As seen in FIGS. 1 and 2, component 12 also preferably includes a pair of orifices 30 which align with orifices 32 of component 14 when components 12 and 14 are coupled together. Preferably, orifices 32 of component 14 also include counterbores 34 which are sized to receive seals 22 therein. Each of the counterbores 34 has a shoulder 36 for engaging one of the seals 22. The depth of counterbores 34 are preferably smaller than the longitudinal dimension of seal 22 such that face 38 of component 12 also engages a portion of seals 22 to compress seals 22 between shoulders 36 and face 38 when components 12 and 14 are coupled together.

Figure 6:
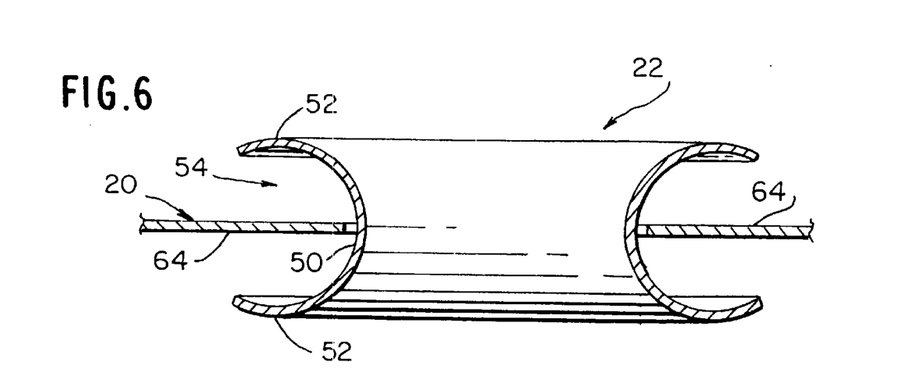
FIG. 6 is an enlarged transverse cross sectional view of the seal retainer and one of the ring seals coupled thereto as illustrated in FIGS. 1–5 and taken along section line 6—6 of FIG. 5.

As seen in FIGS. 2 and 6, seals 22 are preferably conventional ring seals having a C-shaped cross section with a bight portion 50 and a pair of curved leg portions 52. Of course, other types of annular seals could be used with other types of cross-sections. Moreover, seals 22 do not necessarily need to be round. Rather, seal retainer 20 can be modified to accommodate a wide variety of non-circular shapes. Bight portion 50 and leg portions 52 form an outwardly facing cavity or continuous groove 54. Each of the leg portions 52 of seals 22 has an annular sealing surface for engaging face 38 of component 12 or one of the shoulders 36 formed by the counterbores 34 in component 14.

Preferably, seals 22 are metallic seals which are constructed of suitable materials such as stainless steel or INCONEL 718. Ring seals such as ring seals 22 are well known in the art, and thus, ring seals 22 will not be discussed or illustrated in detail herein. Rather, seals 22 will only be discussed and illustrated as necessary to understand the present invention. In the illustrated embodiments, seals 22 have an outer diameter of approximately 0.271 inch and an axial dimension of approximately 0.062 inch.

Referring now to FIGS. 3–6, seal retainer 20 basically includes a body portion 60 with a seal receiving aperture 62 formed therein and a plurality of retaining elements or spring arms 64 extending inwardly from body portion 60 into seal receiving aperture 62. Body portion 60 is also provided with four mounting holes 66 for receiving fasteners 24 therethrough.

Body portion 60 is preferably a very thin piece of resilient metallic material such as stainless steel. Of course, other suitable non-metallic materials, metals or alloys can be used for forming retainer 20. Body portion 60 is preferably a substantially flat planar member which lies in a single plane and has a thickness of approximately 0.003 inch to approximately 0.005 inch. Accordingly, seal retainer 20 is quite thin compared to the axial or longitudinal dimension of seals 22 such that seal retainer 20 does not significantly interfere with or limit the compression of seals 22 between components 12 and 14.

Retaining elements 64 are integrally formed with body portion 60 as a onepiece, unitary member, i.e., seal retainer 20 is constructed of a single piece of material. Retaining elements 64 preferably have the same thickness as body portion 60 and at least initially lie in the same plane as body portion 60. Preferably, seal retainer 20 is stamped to form seal receiving apertures 62, retaining elements 64 and mounting holes 66 utilizing conventional metal stamping techniques. Alternatively, seal retainer 20 could be formed by electro discharge machining or other conventional manufacturing techniques.

In this embodiment, seal retainer 20 is designed for coupling a pair of seals 22 thereto. Of course, seal retainer 20 can be constructed to accommodate more or less seals as needed and/or desired. In the illustrated embodiment, seals 22 are coupled to body portion 60 by providing a single seal receiving aperture 62 in body portion 60 with the free ends of retaining elements 64 being arranged so that a first set of free ends of retaining elements 64 lie at points on a first circle for coupling a first seal 22 thereto and a second set of free ends of retaining elements 64 lie at points on a second circle for retaining a second seal 22 thereto.

Figure 9:
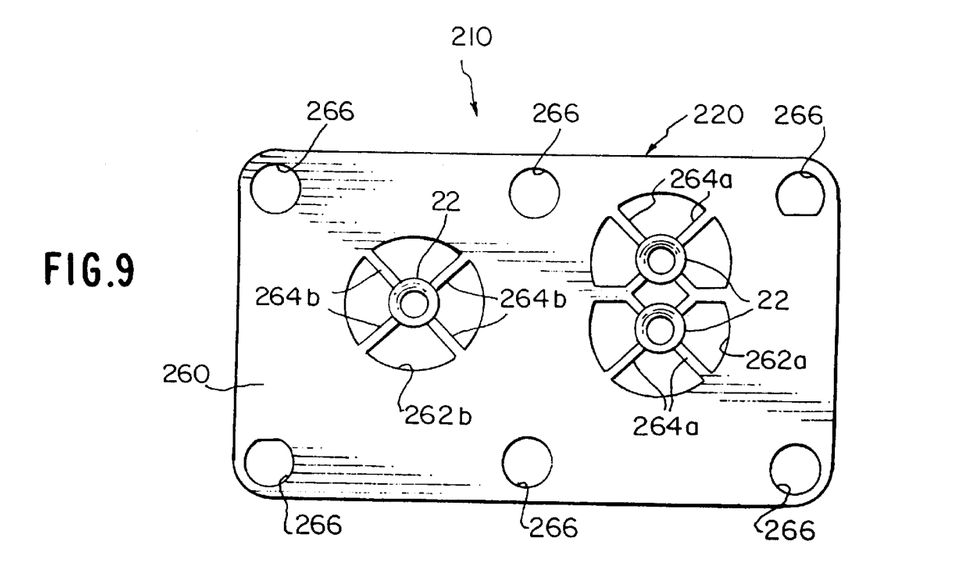
FIG. 9 is a top plan view of a sealing assembly in accordance with a second embodiment of the present invention, which is adapted to receive three ring seals.

Also, in this embodiment, a pair of the retaining elements 64 have a Y-shaped configuration such that its free end engages both of the seals 22. Of course, it will apparent to those skilled in the art from this disclosure that a pair of seal receiving apertures 62 could be utilized as shown in FIG. 9 such that two different sets of retaining elements 64 are utilized to secure seals 22 to body portion 60.

Due to the resiliency of the sheet material used to construct seal retainer 20, retaining elements 64 are flexible resilient elements which can be bent out of the plane of body portion 60 for securing seals 22 thereto as seen in FIG. 2. In particular, seals 22 can be installed into seal receiving aperture 62 by angling the open side of seals 22 into the spring or resilient retaining elements 64 on one side, and then pushing the seals 22 past the opposing retaining elements 64 to allow them to spring into groove 54 on the opposite side of seals 22. Alternatively, seals 22 can be installed into seal receiving aperture 62 by bending body portion 60 until the retaining elements 64 open sufficiently to allow the seals 22 to be inserted between the open. free ends of retaining elements 64 and then reducing the bending of body portion 60 until the retaining elements 64 capture seal 22 by engaging cavity or groove 54 of seals 22.

While four retaining elements 64 are utilized to engage and retain each of the seals 22 to body portion 60, it will be apparent to those skilled in the art that a greater number of retaining elements 64 could be utilized, as well as fewer retaining elements 64 for securing seals 22 to body portion 60. Typically, three or four retaining elements 64 should be utilized for holding each of the seals 22 within seal receiving aperture 62.

Retaining elements 64 should be constructed such that their free ends are cantilevered relative to body portion 60 to allow independent deflection of each retaining element 64 relative to the other retaining element 64 for installation of seals 22 therein.

Moreover, it will be apparent to those skilled in the art from this disclosure that if more than one seal 22 is to be installed in the body portion 60 of seal retainer 20, that the number of spring arms or retaining elements 64 would be increased. Also it will be apparent to those skilled in the art that when seals 22 are closely spaced together, seals 22 may have one or more common retaining elements 64 supporting them to accommodate the additional seals more efficiently as shown.

Moreover, it will be apparent to those skilled in the art from this disclosure that retaining elements 64 can have a wide variety of shapes for retaining seals 22 within seal receiving aperture 62. In any event, the important concept is that the retaining elements 64 engage the structure of seals 22 without interfering with the compression of seals 22 and that the retaining elements have some resiliency to allow installation of seals 22 into retainer 20 and any required movement of the seals 22 into the counterbore(s) of the mating components.

Figure 3:
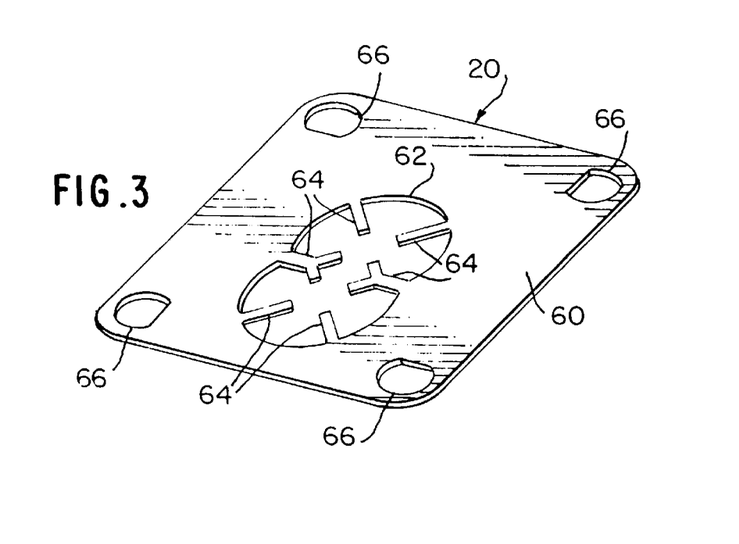
FIG. 3 is a perspective view of the seal retainer illustrated in FIGS. 1 and 2 in accordance with the present invention, without the ring seals coupled thereto.
Figure 4:
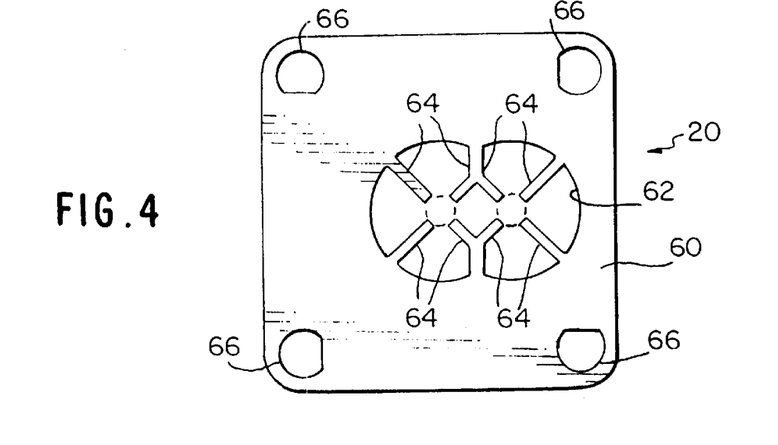
FIG. 4 is a top plan view of the seal retainer illustrated in FIGS. 1–3 in accordance with the present invention, without the ring seals coupled thereto.
Figure 5:
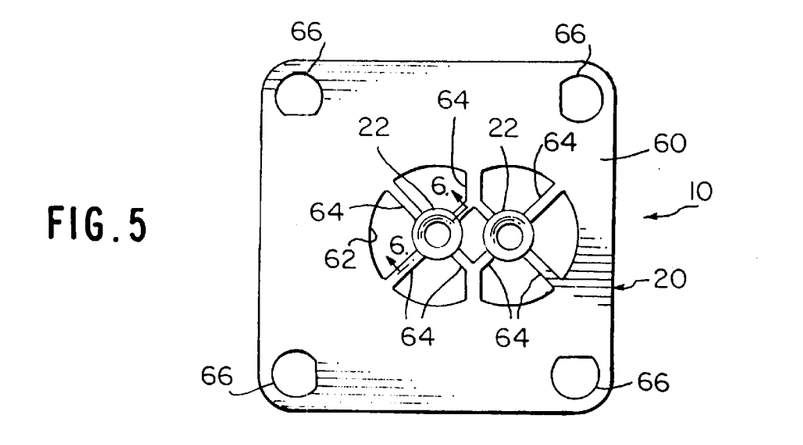
FIG. 5 is a top plan view of the seal retainer illustrated in FIGS. 1–4 in accordance with the present invention, with a pair of ring seals coupled thereto.

As seen in FIGS. 3–5, one or more of the mounting holes 66 is preferably configured to provide retention on the fastener or mounting bolts 24 after the fasteners 24 have been passed through bores 26 of component 12 which is to be coupled and sealed to the mating component 14. One possible configuration of mounting holes 66 is shown in the figures. In the illustrated embodiment, four of the mounting holes 66 are D-shaped to threadedly receive fasteners 24. In particular, the flat side of the "D" of each mounting hole 66 is dimensioned such that the clearance between the flat side and the radiused portion is less than the minimum outside diameter of fasteners 24 and greater than the largest possible thread root diameter of fasteners 24. This provides a fit such that fasteners 24 may be threaded through mounting holes 66 of seal retainer 20, but seal retainer 20 will not freely slide over fasteners 24.

It should be apparent to those skilled in the art from this disclosure that a wide variety of protrusion shapes into one or more of the mounting holes 66 can be used to create the same effect. For example, other shapes of mounting holes 66 would be a semi-circular shape(s), square or rectangular tabs, etc. intruding into the hole. Moreover, not all of the mounting holes need to be configured to be retained on fasteners 24.

Installation of Sealing Assembly 10

As mentioned above, seals 22 are coupled to seal retainer 20 to properly locate seals 22 with respect to orifices 30 and 32 of components 12 and 14. This arrangement allows seal assembly 10 to be installed between components 12 and 14 without contact by hands or tools which could contaminate or damage seals 22.

Seals 22 are installed within seal receiving aperture 62 of body portion 60 via retaining elements 64. In particular, retaining elements 64 can be deflected out of the plane of body portion 60 so that the free ends of retaining elements 64 are received in the annular cavity or groove 54 of each of the seals 22 for retaining seals 22 to body portion 60. As mentioned above, this can be done by angling one side of seals 22 such that two of the spring arms or retaining elements 64 engage annular cavity or groove 54 of seals 22 and then pushing seals 22 past the opposing two arms or retaining elements 64 to allow them to spring into the other side of cavity or groove 54 of seals 22 to capture seals 22 therebetween.

Alternatively, seals 22 can be installed into seal receiving aperture 62 by bending body portion 60 of seal retainer 20 until the free ends of spring arms or retaining elements 64 open sufficiently to allow seals 22 to be inserted between the free ends of retaining elements 64, and then reducing the bending of body portion 60 such that the retaining elements 64 return to the plane of body portion 60 to capture seals 22 via the free ends of retaining elements 64 engaging the annular cavity or groove 54 of seals 22.

Once the sealing assembly 10 is complete, sealing assembly 10 is then coupled to one of the components 12 or 14. In this particular embodiment, sealing assembly 10 is retained to component 12 via fasteners 24. In particular, fasteners 24 are inserted through bores 26 of component 12 and then threaded into the four D-shaped mounting holes 66 for retaining sealing assembly 10 thereto. In this position, seals 22 are correctly located since mounting holes 66 not only retain sealing assembly 10 to component 12 but also ensures proper location of seals 22 relative to orifices 30 and 32 of components 12 and 14, respectively.

Next, components 12 and 14 are coupled together by fasteners 24. In particular, fasteners 24 are now threaded into threaded bores 28 of component 14. When fasteners 24 are tightened down, the annular sealing surfaces of leg portions 52 of seals 22 will engage shoulders 36 of component 14 and face 38 of component 12 to create a seal therebetween. Moreover, seals 22 are compressed to ensure a fluid tight seal between components 12 and 14 about orifices 30 and 32.

In this particular configuration, spring arms or retaining elements 64 are of a sufficient length and resiliency to allow seals 22 to be deflected slightly out of the plane of body portion 60 and into counterbore 34 of component 14 as seen in FIG. 2. Accordingly, the dimensions and proportions of spring arms or retaining elements 64, including their length, width, tip design and the overall thickness of seal retainer 20, are determined by the size of the seals and the available area under the mating components to be sealed. The overall concept can be applied to any number of seals and/or bolt patterns with any number of bolts and/or obvious variations.

Sealing assembly 10 is especially applicable to the semi-conductor process and vacuum equipment industries, as well as other industries where high reliability and extremely tight sealing is required, e.g., a seal which passes a leakage test of $10^{-9}$ cc/sec helium. The sealing assembly 10 is also applicable for sealing location and retention whenever an externally pressurized seal configuration is suitable.

Other variations and/or modifications of the present invention includes retaining multiple seals of various numbers and arrangements, as well as accommodating various numbers and arrangements of fasteners. Moreover, the various thicknesses and types of sheet materials can be utilized to construct seal retainer 20 in accordance with the present invention. Also, while circular ring seals 22 are illustrated, it will be apparent to those skilled in the art that non-circular configurations for seals 22 could also be utilized with minor modifications to the arrangement and orientation of retaining elements 64.

Installation of Sealing Assembly 10 Between Components 112 and 114

Figure 7:
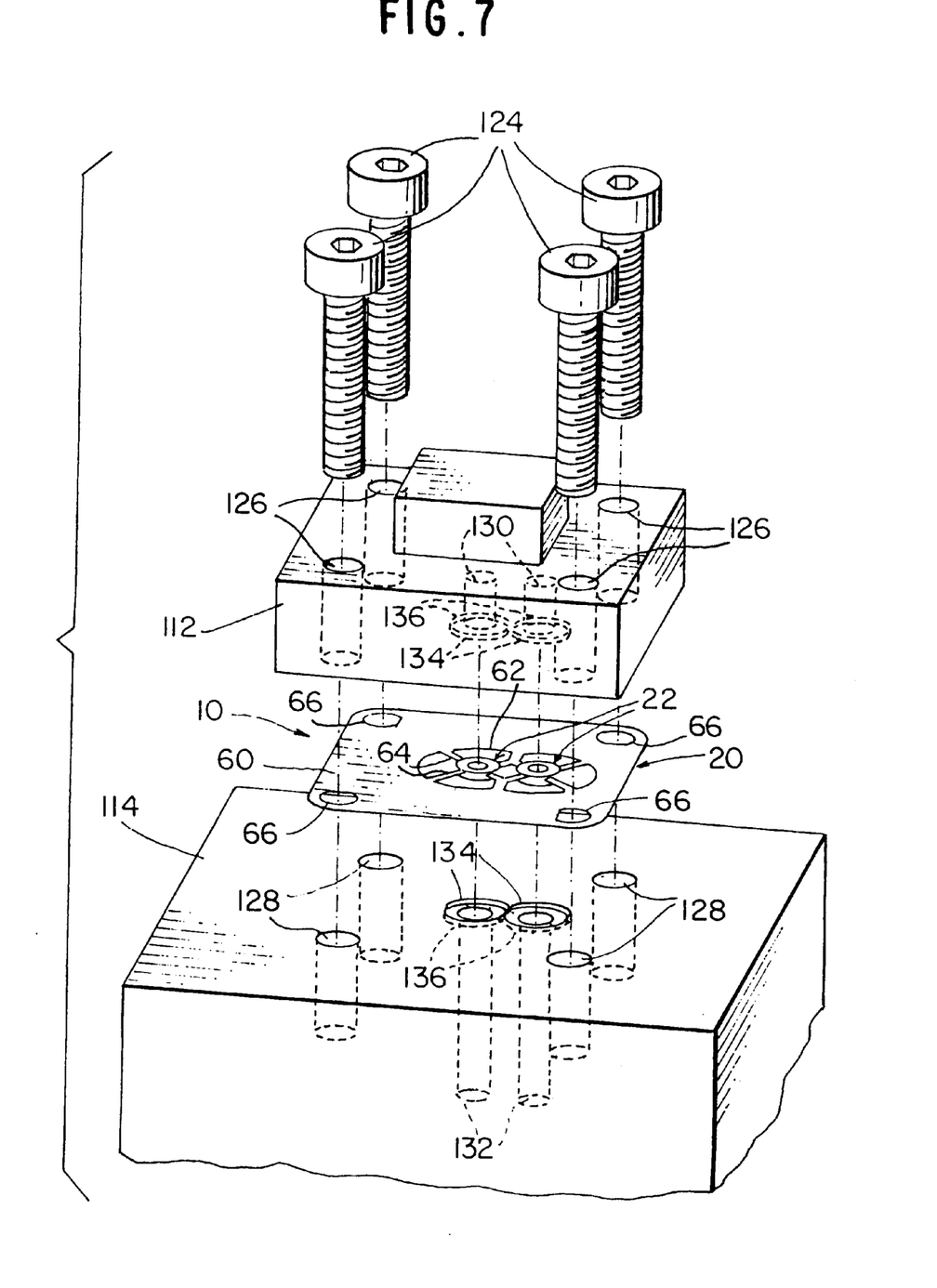
FIG. 7 is an exploded perspective view of the retainer seal illustrated in FIGS. 3–6 in accordance with the first embodiment of the present invention, but just prior to being coupled between a pair of mating components in which each of the mating components has a counterbore or groove for receiving a part of each of the ring seals therein.
Figure 8:
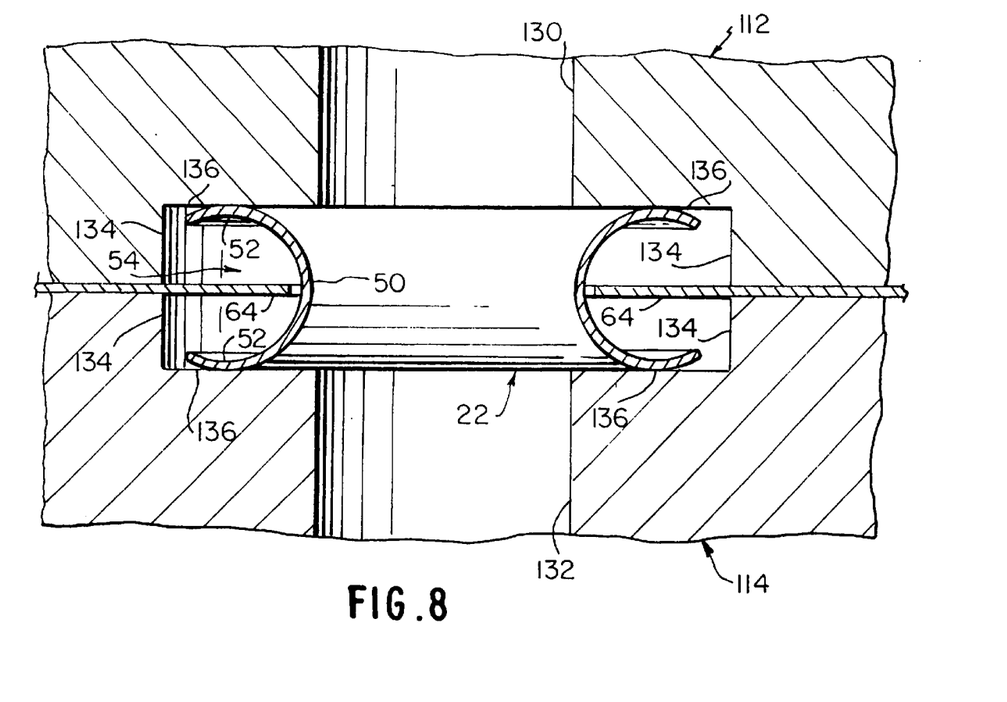
FIG. 8 is an enlarged, cross sectional view of the sealing assembly illustrated in FIGS. 3–6, but coupled between the mating members or components illustrated in FIG. 7.

Referring now to FIGS. 7 and 8, sealing assembly 10 is illustrated as being used to seal components 112 and 114. In this example, component 112 is releasably coupled to component 114 via four bolts or fasteners 124 in a conventional manner. Of course, more or less bolts can be utilized depending upon the application. More specifically, component 112 has four bores 126 for slideably receiving fasteners 124 therethrough, while component 114 has four threaded bores 128 for threadedly receiving fasteners 124 therein, such that component 112 is releasably coupled to component 114 via fasteners 124.

Component 112 also preferably includes a pair of orifices 130 which align with orifices 132 of component 114 when components 112 and 114 are coupled together. Preferably, orifices 130 and 132 of components 112 and 114 also include counterbores 134 which are sized to receive seals 22 therein. Each of the counterbores 134 has a shoulder 136 for engaging one of the seals 22.

The main difference between components 12 and 14 and components 112 and 114 is that components 112 and 114 each have a counterbore 134 which has a depth which is substantially half of counterbore 34 of component 14, as discussed above.

This arrangement has the benefit of protecting both of the sealing surfaces of seal 22 and does not require the deflection of retaining elements 64 into either of the counterbores 134 as seen in FIG. 8. In view of the similarity of this second application of sealing assembly 10 to the first application, discussed above, this second application of sealing assembly 10 will not be discussed or illustrated in further detail.

Second Embodiment of FIG. 9

Referring now to FIG. 9, a sealing assembly 210 in accordance with a second embodiment of the present invention is illustrated. This embodiment is similar to the first embodiment, except that sealing assembly 210 has been modified to have a pair of seal receiving apertures 262a and 262b for supporting three seals 22 therein. Accordingly, sealing assembly 210 will not be discussed in as much detail as sealing assembly 10. Rather, it will be apparent to those skilled in the art that the description of sealing assembly 110 applies to sealing assembly 210.

Sealing assembly 210 is also especially useful in the semi-conductor process equipment and vacuum equipment industries or any other industries where high reliability and extremely tight sealing is required. In particular, sealing assembly 210 is preferably designed to provide a highly reliable seal. For example, sealing assembly 210 is preferably designed to pass a leakage test on the order of magnitude of $10^{-9}$ cc/sec helium.

Seal retainer 220 basically includes a body portion 260 with a pair of seal receiving apertures 262a and 262b formed therein and a plurality of retaining elements or spring arms 264a and 264b extending inwardly from body portion 260 into seal receiving aperture 262a and 262b, respectively. Body portion 260 is also provided with six mounting holes 266 for receiving fasteners therethrough.

Retainer 220 is preferably a very thin piece of resilient metallic material such as stainless steel. Of course, other suitable non-metallic materials, metals or alloys, can be used for forming retainer 220. Retainer 220 is preferably a substantially flat planar member which lies in a single plane and has a thickness of approximately 0.003 inch to approximately 0.005 inch. Accordingly, seal retainer 220 is quite thin compared to the axial or longitudinal dimension of seals 22 such that seal retainer 220 does not significantly interfere with or limit the compression of seals 222 between a pair of mating components.

Third Embodiment of FIGS. 10–13

Referring now to FIGS. 10–13, a sealing assembly 310 in accordance with a third embodiment of the present invention is illustrated. Sealing assembly 310 is designed to be installed in the same manner as sealing assembly 10 which is discussed above. In fact, this embodiment is substantially identical to the first embodiment, except that sealing assembly 310 has been modified to include an indicator 321 and tabs 365 which extend inwardly into mounting holes 366. Accordingly, sealing assembly 310 will not be discussed in as much detail as sealing assembly 10. Rather, it will be apparent to those skilled in the art that most of the description of sealing assembly 10 applies to sealing assembly 310.

Similar to the preceding embodiments, sealing assembly 310 is also especially useful in the semi-conductor process equipment and vacuum equipment industries or any other industries where high reliability and extremely tight sealing is required. In particular, sealing assembly 310 is preferably designed to provide a highly reliable seal. For example, sealing assembly 310 is preferably designed to pass a leakage test on the order of magnitude of $10^{-9}$ cc/sec helium.

Retainer 320 is preferably a very thin piece of resilient metallic material such as stainless steel. Of course, other suitable non-metallic materials, metals or alloys can be used for forming retainer 320. Retainer 320 is preferably a substantially flat planar member which lies in a single plane and has a thickness of approximately 0.003 inch to approximately 0.005 inch. Accordingly, seal retainer 320 is quite thin compared to the axial or longitudinal dimension of seals 22 such that seal retainer 320 does not significantly interfere with or limit the compression of seals 22 between a pair of mating components.

Figure 13:
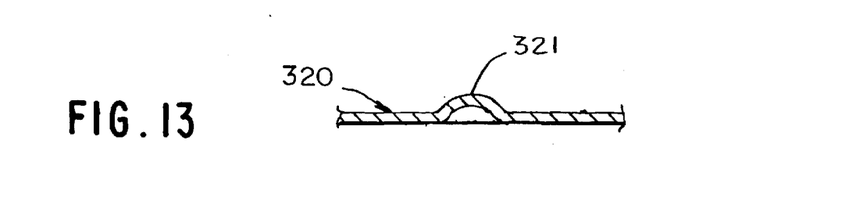
FIG. 13 is an enlarged, partial cross-sectional view of the seal retainer illustrated in FIGS. 10–12 as seen along section line 13—13 of FIG. 12.

As best seen in FIG. 13, seal retainer 320 is provided with a raised protrusion or dimple which forms indicator 321 to show if the seal retainer 320 has been used. Specifically, indicator 321 is raised out of the plane of body portion 360. such that it will plastically deform when seal retainer 320 is compressed between components 12 and 14. In other words, after seal retainer 320 has been used, indicator 321 will be permanently flattened into the plane of body portion 360. While indicator 321 is illustrated as a raised dimple, it will be apparent to those skilled in the art from this disclosure that indicator 321 can have a variety of shapes. In any event, the shape of indicator 321 should be shaped so that when seal retainer 320 is squeezed between a pair of components such as components 12 and 14, indicator 321 will be plastically deformed to show that the retainer has been used.

Figure 10:
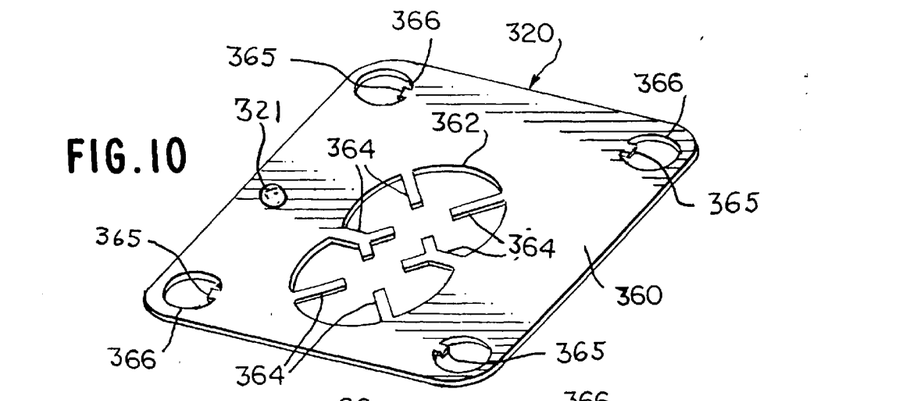
FIG. 10 is a perspective view of a seal retainer in accordance with a third embodiment of the present invention.
Figure 11:
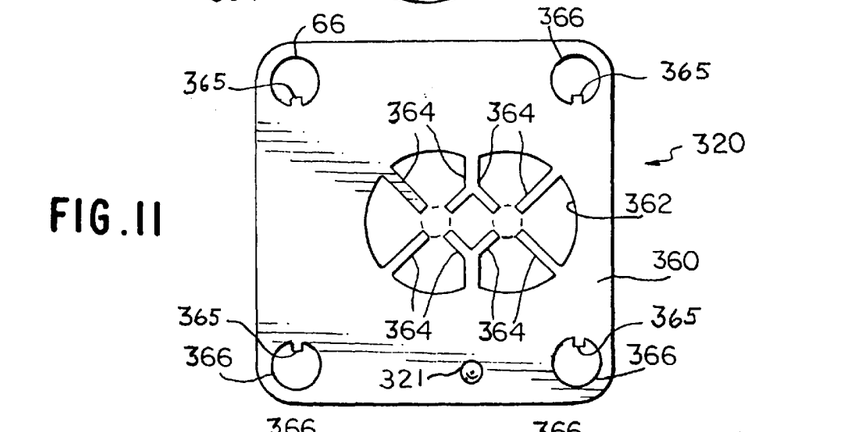
FIG. 11 is a top plan view of the seal retainer illustrated in FIG. 10, with the sealing rings removed.
Figure 12:
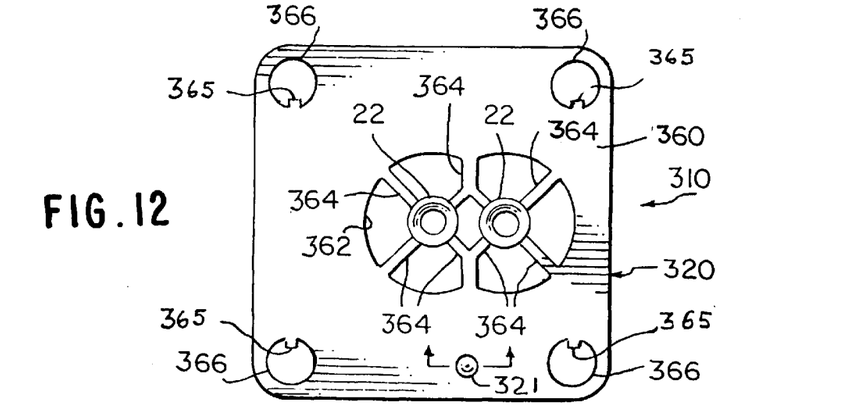
FIG. 12 is a top plan view of the seal retainer of the sealing assembly illustrated in FIGS. 10 and 11, with two sealing rings installed therein.

Seal retainer 320 basically includes a body portion 360 with a seal receiving aperture 362 formed therein and a plurality of retaining elements or spring arms 364 extending inwardly from body portion 360 into seal receiving aperture 362. Body portion 360 is also provided with four mounting holes 366 for receiving fasteners therethrough.

In this embodiment, one or more of the mounting holes 366 is preferably configured to provide retention on the fastener or mounting bolts 24 after the fasteners 24 have been passed through bores 26 of component 12 which is to be coupled and sealed to the mating component 14. One possible configuration of mounting holes 366 is shown in the figures. In the illustrated embodiment, each mounting hole 366 has an inwardly extending tab 365 which engages the root of the threads of one of the fasteners 24. In particular, tab 365 of each mounting hole 366 extends radially inwardly such that the diameter of each mounting hole 366 is effectively reduced at tab 365. In other words, the diameter of each mounting hole 366 at tab 365 is less than the minimum outside thread diameter of fasteners 24 and slightly greater than the largest possible thread root diameter of fasteners 24. This provides a fit such that fasteners 24 may be threaded or inserted into mounting holes 366 of seal retainer 320, but seal retainer 320 will not freely slide over fasteners 24.

It should be apparent to those skilled in the art from this disclosure that mounting holes 366 can have one or more tabs 365 extending therein. These tabs can have a wide variety of shapes. For example, other shapes of mounting holes 366 would be a semi-circular shape(s), square or rectangular tabs, etc. intruding into the hole. Moreover, not all of the mounting holes need to be configured to be retained on fasteners 24.

While various embodiments have been chosen to illustrate the present invention, it will be understood by those skilled in the art from this disclosure that various changes and modifications can be made therein without departing from the scope of the invention as defined in the appended claims.

What is claimed is:

1. A seal retainer for coupling at least one seal thereto, comprising:

a substantially flat, flexible body portion lying in a plane and with at least one seal receiving aperture;

an indicator integrally formed with said body portion as a one-piece, unitary member, said indicator being a deformable member which extends outwardly from said plane of said body portion; and at least one resilient retaining element integrally formed with said body portion as a one-piece, unitary member, said at least one retaining element being formed substantially in said plane of said flexible body and extending inwardly from said body portion into said at least one seal receiving aperture to a free end.

2. A seal retainer according to claim 1, wherein said body portion includes at least one mounting hole spaced from said at least one seal receiving aperture.

3. A seal retainer according to claim 2, wherein said at least one mounting hole includes an inwardly extending tab for engaging a mounting member to retain said body portion thereon.

4. A seal retainer according to claim 1, wherein said body portion and said at least one retaining element are constructed of a thin metallic material.

5. A seal retainer according to claim 1, wherein said body portion and said at least one retaining element are constructed of a thin material having a thickness ranging from approximately 0.003 inch to approximately 0.005 inch.

6. A seal retainer according to claim 1, wherein said body portion has a plurality of said retaining elements with free ends adapted to engage at least one seal, said retaining elements are resiliently cantilevered relative to said body portion to permit said free ends of said retaining elements to be resiliently deflected out of said plane of said body portion.

7. A seal retainer according to claim 6, wherein said retaining elements are arranged for supporting at least two separate seals.

8. A seal retainer according to claim 6, wherein said body portion includes at least one mounting hole.

9. A seal retainer according to claim 8, wherein said at least one mounting hole includes an inwardly extending tab for engaging a mounting member to retain said body portion thereon.

10. A seal retainer according to claim 1, wherein said indicator is permanently deformed upon compression into the plane of said body portion to indicate that the seal retainer has been used.

11. A seal retainer according to claim 1, wherein said indicator is spaced from said seal receiving aperture.

12. A seal retainer according to claim 1, wherein said indicator is a raised dimple extending outward from the plane of said body portion.

13. A sealing assembly for creating a seal between first and second members, comprising:

at least one annular seal with first and second longitudinally facing sealing surfaces and an outwardly facing cavity located between said first and second longitudinally facing sealing surfaces; and a seal retainer coupled to said at least one seal, said seal retainer including a substantially flat body portion lying in a plane and with at least one resilient retaining element integrally formed with said body portion as a one-piece, unitary member for engaging said cavity of said at least one seal to retain said at least one seal thereto, said retaining element being formed in said plane of said body portion, said seal retainer further including an indicator integrally formed with said body portion as a one-piece, unitary member, said indicator being a deformable member which extends outwardly from said plane of said body portion and is deformable by said first and second members.

14. A sealing assembly according to claim 13, wherein said cavity is a continuous, annular groove.

15. A sealing assembly according to claim 14, wherein said at least one seal is a metallic, circular sealing ring.

16. A sealing assembly according to claim 13, wherein said body portion has at least one seal receiving aperture with said at least one retaining element extending therein.

17. A sealing assembly according to claim 16, wherein said body portion has a plurality of said retaining elements with free ends adapted to engage said at least one seal.

18. A sealing assembly according to claim 17, wherein said retaining elements are resiliently cantilevered relative to said body portion to permit a seal coupled thereto to be deflected out of said plane of said body portion.

19. A sealing assembly according to claim 16, wherein said body portion and said at least one retaining element are constructed of a thin material having a thickness ranging from approximately 0.003 inch to approximately 0.005 inch.

20. A sealing assembly according to claim 13, wherein said indicator is permanently deformed upon compression into the plane of said body portion to indicate that the seal retainer has been used.

21. A sealing assembly according to claim 13, wherein said indicator is spaced from said at least one resilient retaining element.

22. A sealing assembly according to claim 13, wherein said indicator is a raised dimple extending outward from the plane of said body portion.

23. A sealing assembly for creating a seal between first and second members comprising:

at least one annular seal with first and second longitudinally facing sealing surfaces and an outwardly facing cavity located between said first and second longitudinally facing sealing surfaces; and a seal retainer coupled to said at least one seal, said seal retainer including a substantially flat body portion lying in a plane and with at least one seal receiving aperture and at least one resilient retaining element integrally formed with said body portion as a one-piece, unitary member for engaging said cavity of said at least one seal to retain said at least one seal thereto, said seal retainer further including an indicator integrally formed with said body portion as a one-piece, unitary member, said indicator being a deformable member which extends outwardly from said plane of said body portion;

said body portion including at least one mounting hole spaced from said at least one seal receiving aperture.

24. A sealing assembly according to claim 23, wherein said at least one mounting hole includes an inwardly extending tab for engaging a mounting member to retain said body portion thereon.

* * * * *